United States Patent
Shin et al.

(10) Patent No.: US 11,332,641 B2
(45) Date of Patent: May 17, 2022

(54) POLISHING SLURRY COMPOSITION ENABLING IMPLEMENTATION OF MULTI-SELECTIVITY

(71) Applicant: KCTECH CO., LTD., Gyeonggi-do (KR)

(72) Inventors: Gi Joo Shin, Incheon (KR); Jung Yoon Kim, Gyeonggi-do (KR); Kwang Soo Park, Gyeonggi-do (KR); Soo Wan Choi, Seoul (KR)

(73) Assignee: KCTECH CO., LTD., Gyeonggi-do (KR)

( * ) Notice: Subject to any disclaimer, the term of this patent is extended or adjusted under 35 U.S.C. 154(b) by 0 days.

(21) Appl. No.: 17/123,115

(22) Filed: Dec. 16, 2020

(65) Prior Publication Data

US 2021/0189178 A1    Jun. 24, 2021

(30) Foreign Application Priority Data

Dec. 19, 2019    (KR) ......................... 10-2019-0170938

(51) Int. Cl.
| | | |
|---|---|---|
| *C09G 1/02* | (2006.01) | |
| *C09K 3/14* | (2006.01) | |
| *H01L 21/3105* | (2006.01) | |

(52) U.S. Cl.
CPC .............. *C09G 1/02* (2013.01); *C09K 3/1409* (2013.01); *C09K 3/1436* (2013.01); *H01L 21/31053* (2013.01)

(58) Field of Classification Search
CPC ...... C09G 1/02; C09K 3/1409; C09K 3/1436; C09K 3/1463; H01L 21/31053; H01L 21/30625; C08G 73/0233; C08L 79/02
USPC ............................ 438/690–693; 51/307–309
See application file for complete search history.

(56) References Cited

U.S. PATENT DOCUMENTS

2018/0002571 A1* 1/2018 Stender ................. B24B 37/044

FOREIGN PATENT DOCUMENTS

| CN | 101065458 | 10/2007 |
|---|---|---|
| CN | 104284960 | 1/2015 |
| CN | 106978086 | 7/2017 |
| CN | 107530297 | 1/2018 |
| CN | 113195659 | 7/2021 |
| KR | 101737943 | 5/2017 |
| KR | 20190074594 | 6/2019 |
| TW | 201336978 | 9/2013 |
| TW | 201927950 | 7/2019 |
| WO | 2019124740 | 6/2019 |

OTHER PUBLICATIONS

Translation of KR101737943B1 (Year: 2017).*
Translation of KR20190074594A (Year: 2019).*

* cited by examiner

*Primary Examiner* — Duy Vu N Deo
(74) *Attorney, Agent, or Firm* — JCIPRNET

(57) ABSTRACT

A polishing slurry composition enabling implementation of multi-selectivity is provided. The polishing slurry composition includes: a polishing liquid including abrasive particles; and an additive liquid, in which the additive liquid includes a polymer having an amide bond, and a cationic polymer.

14 Claims, No Drawings

POLISHING SLURRY COMPOSITION ENABLING IMPLEMENTATION OF MULTI-SELECTIVITY

CROSS-REFERENCE TO RELATED APPLICATION

This application claims the benefit of Korean Patent Application No. 10-2019-0170938, filed on Dec. 19, 2019, in the Korean Intellectual Property Office, the disclosure of which is incorporated herein by reference.

BACKGROUND

1. Field of the Invention

Example embodiments relate to a polishing slurry composition enabling implementation of multi-selectivity, and more specifically, to a polishing slurry composition for a manufacturing process of a semiconductor device.

2. Description of the Related Art

As semiconductor devices become diverse and highly integrated, finer pattern forming techniques are being used, and accordingly the surface structure of the semiconductor devices is becoming more complicated and a step height of surface films also becomes greater. A chemical mechanical polishing (CMP) process is used as a planarization technique for removing a step height on a specific film formed on a substrate in the manufacture of semiconductor devices. For example, as a process for removing an insulating film formed in an excessive amount for interlayer insulation, a process for planarizing the insulating film for shallow trench isolation (STI) performing an insulation function between an interlayer dielectric (ILD) and a chip, a logic process, and a process for forming metal conductive films such as wiring, a contact plug, a via contact, etc. have been widely used. For example, in an operation of planarizing a merged memory logic (MML) device, there is a very large step height between a memory cell region in which at least four polysilicon layers are formed and a logic region in which less than two polysilicon layers are formed. Such a step height of the two regions may cause a defocusing problem in a memory region and a logic region during the photolithography process. A planarization process using CMP is being used to relieve such a step height. Although a method of implementing selectivity of two membranes by injecting an additive for securing polishing rate of a silicon nitride membrane into a slurry, thereby reducing high polishing rate performance of a silicon nitride film and the polishing rate of silicon oxide has been used during the CMP process, there are problems that the CMP process becomes complicated, and costs are increased since it is difficult to control and maintain dispersion stability of the slurry, and the replacement process of the slurry is essential for each process.

SUMMARY

The present disclosure is to solve the foregoing problems, and an aspect of the present disclosure provides a polishing slurry composition which enables implementation of multi-selectivity and adjustment of polishing speed depending on a target film during the polishing process, and can be used in a semiconductor manufacturing process.

However, the problems to be solved in the present disclosure are not limited to the foregoing problems, and other problems not mentioned herein would be clearly understood by one of ordinary skill in the art from the following description.

According to an aspect, there is provided a polishing slurry composition including: a polishing liquid including abrasive particles; and an additive liquid, in which the additive liquid includes a polymer having an amide bond, and a cationic polymer.

The polymer having the amide bond may include at least one of polymers represented by Chemical Formula 1.

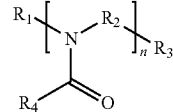

[Chemical Formula 1]

In Chemical Formula 1, $R_1$, $R_3$ and $R_4$ are each selected from hydrogen, a hydroxy group, a $C_{1-30}$ alkyl group, a $C_{2-30}$ alkenyl group, a $C_{2-30}$ alkynyl group, a $C_{1-30}$ alkoxy group, a $C_{6-30}$ aryl group, a $C_{5-30}$ heteroaryl group including one or more heteroatoms of N, O or S, a $C_{4-30}$ heterocyclic group including one or more heteroatoms of N, O or S, a $C_{7-30}$ aralkyl group, an amine group, —NH($R_4$)—$R_5$ (herein, $R_4$ is a $C_{1-30}$ alkylene or a $C_{2-30}$ alkenylene, and $R_5$ is hydrogen or a hydroxy group), an oxyamine group, an azide group, and a thiol group, $R_2$ is a simple bond, a substituted or unsubstituted $C_{1-30}$ alkylene, a $C_{2-30}$ alkenylene, a $C_{7-30}$ cycloalkylene, a $C_{6-30}$ arylene, a $C_{7-30}$ arylalkylene, or a $C_{2-30}$ alkynylene, and n is an integer of 1 or more.

The polymer having the amide bond may include at least one of poly(2-methyl-2-oxazoline), poly(2-methyl-2-oxazoline) with a hydroxyl end group, poly(2-methyl-2-oxazoline) with α-benzyl and ω-azide ends, poly(2-methyl-2-oxazoline) with an azide end, poly(2-methyl-2-oxazoline) with a piperazine end, poly(2-ethyl-2-oxazoline), poly(2-ethyl-2-oxazoline) with an alkyne end, poly(2-ethyl-2-oxazoline) with α-benzyl and ω-thiol ends, poly(2-ethyl-2-oxazoline) with α-methyl and ω-hydroxyethylamine ends, poly(2-ethyl-2-oxazoline) with an amine end, poly(2-ethyl-2-oxazoline) with a piperazine end, poly(2-propyl-2-oxazoline), poly(2-propyl-2-oxazoline) with an azide end, and derivatives thereof.

The polymer having the amide bond may have a weight average molecular weight of 1,000 to 5,000,000.

The polymer having the amide bond may be present in an amount of 0.01 wt % to 0.2 wt % in the additive liquid.

The cationic polymer may include at least one of: poly (diallyldimethylammonium chloride); poly[bis(2-chloroethyl) ether-alt-1,3-bis[3-(dimethylamino)propyl]urea]; ethanol, 2,2',2''-nitrilotris-, polymer with 1,4-dichloro-2-butene and N,N,N',N'-tetramethyl-2-butene-1,4-diamine; hydroxyethyl cellulose dimethyl diallylammonium chloride copolymer; copolymer of acrylamide and diallyldimethylammonium chloride; copolymer of acrylamide and quaternized dimethylammoniumethyl methacrylate; copolymer of acrylic acid and diallyldimethylammonium chloride; acrylamide-dimethylaminoethyl methacrylate methyl chloride copolymer; quaternized hydroxyethyl cellulose; copolymer of vinylpyrrolidone and quaternized dimethylaminoethyl methacrylate; copolymer of vinylpyrrolidone and quaternized vinylimidazole; copolymer of vinylpyrrolidone and methacrylamidopropyl trimethylammonium; poly(2-methacryloxyethyltrimethylammonium chloride); Poly(acrylamide 2-methacryloxyethyltrimethyl ammonium chloride);

poly[2-(dimethylaminoethyl methacrylate methyl chloride]; poly[(3-acrylamidopropyl)trimethylammonium chloride]; poly[3-methacrylamidopropyl trimethylammonium chloride]; poly[oxyethylene(dimethylamino)ethylene (dimethylimino)ethylene dichloride]; terpolymer of acrylic acid, acrylamide, and diallyldimethylammonium chloride; terpolymer of acrylic acid, methacrylamidopropyl trimethylammonium chloride, and methyl acrylate; terpolymer of vinylcaprolactam, vinylpyrrolidone, and quaternized vinylimidazole; poly(2-methacryloxyethyl phosphorylchlorine-co-n-butyl methacrylate); poly[(dimethylamino)ethyl acrylate benzyl chloride quaternary salt] (PDMAEA BCQ); and poly[(dimethylamino)ethyl acrylate methyl chloride quaternary salt] (PDMAEA MCQ).

The cationic polymer may be present in an amount of 0.001 wt % to 0.01 wt % in the additive liquid.

The abrasive particles may have a positive charge on the surface thereof.

The abrasive particles may include at least one of a metal oxide, an organic or inorganic matter-coated metal oxide, and the metal oxide in a colloidal state, and the metal oxide may include at least one of silica, ceria, zirconia, alumina, titania, barium titania, germania, mangania, and magnesia.

The abrasive particles may include primary particles having a particle size of 5 nm to 150 nm and secondary particles having a particle size of 30 nm to 300 nm, and the abrasive particles may be present in an amount of 0.1 wt % to 10 wt % in the polishing slurry composition.

The additive liquid may further include amino acid, and the amino acid may be present in an amount of 0.1 wt % to 0.5 wt % in the additive liquid.

The amino acid is a polar amino acid, and the polar amino acid may include at least one of glycine, serine, threonine, cysteine, tyrosine, asparagine, and glutamine.

The polymer having the amide bond and the cationic polymer may have a content ratio of 20:1 to 30:1.

The polishing liquid and the additive liquid may have a ratio (volume ratio) of 1:1 to 5:1 during a polishing process using the polishing slurry composition, and the ratio may be adjusted according to the flow rate when injecting the polishing liquid and the additive liquid.

When polishing a substrate including a silicon oxide film, a silicon nitride film, and a polysilicon film by the polishing slurry composition, the silicon oxide film may have a polishing speed of 1,000 Å/min to 4,000 Å/min, the silicon nitride film may have a polishing speed of 700 Å/min to 1,300 Å/min, and a polishing selectivity of the silicon oxide film to the polysilicon film may be 200 or more.

A polishing selectivity of the silicon oxide film to the silicon nitride film may be 1 or more.

When polishing a substrate including a silicon oxide film, a silicon nitride film, and a polysilicon film by the polishing slurry composition, the silicon oxide film may have a polishing speed of 50 Å/min to 500 Å/min, and the silicon nitride film may have a polishing speed of 700 Å/min to 1,000 Å/min.

A polishing selectivity of the silicon oxide film to the silicon nitride film may be 1 or less.

Additional aspects of example embodiments will be set forth in part in the description which follows and, in part, will be apparent from the description, or may be learned by practice of the disclosure.

According to example embodiments, a polishing slurry composition enabling implementation of multi-selectivity and adjustment of polishing speed when performing a polishing process may be provided. Further, as the polishing slurry composition may adjust selectivity required according to the amount of an additive used, the polishing slurry composition not only may be used in various processes, for example, a semiconductor manufacturing process, but also may exhibit a surface scratch ameliorating effect after performing the polishing process.

DETAILED DESCRIPTION

Hereinafter, example embodiments of the present disclosure will be described in detail. When it is determined detailed description related to a related known function or configuration they may make the gist of the present disclosure unnecessarily ambiguous in describing the present disclosure, the detailed description will be omitted. Also, terms used in the present specification, as terms used to appropriately describe example embodiments of the present disclosure, may be changed depending on a user, the intent of an operator, or a custom of a field to which the present disclosure pertains. Accordingly, the terms must be defined based on the following overall description of the present specification.

Throughout the whole specification, if a prescribed part "includes" a prescribed element, this means that another element can be further included instead of excluding another element.

Hereinafter, a polishing slurry composition according to the present disclosure will be described in detail with reference to example embodiments. However, the present disclosure is not limited to such example embodiments.

According to an example embodiment of the present disclosure, the polishing slurry composition may include a polishing liquid including abrasive particles, and an additive liquid, may enable implementation of multi-selectivity depending on a polishing target film and may exhibit a polishing speed adjusting function and an automatic polishing stop function.

According to an example embodiment of the present disclosure, the abrasive particles may be present in an amount of 0.1 to 10 wt % in the polishing liquid on the basis of the polishing slurry composition. It is difficult to implement a desired polishing speed depending on a polishing target film when the abrasive particles are present in an amount of less than 0.1 wt % in the polishing liquid, and the polishing speed is too high, and there is a possibility that surface flaws such as dishing, erosion, defects, scratches, etc. may be occurred by adsorbability of particles remaining on the surface due to an increase in the number of abrasive particles when the abrasive particles are present in an amount of more than 10 wt % in the polishing liquid.

The abrasive particles may be manufactured by a solid phase method or a liquid phase method, and the abrasive particles may be dispersed so that the surface of the abrasive particles has a positive charge. The abrasive particles may be manufactured by applying a sol-gel method of generating a chemical reaction of an abrasive particle precursor in an aqueous solution and growing a crystal to obtain fine particles, a coprecipitation method of precipitating abrasive particle ions in the aqueous solution, a hydrothermal synthesis method of forming abrasive particles under high temperatures and high pressures, or the like to the liquid phase method. The abrasive particles may be manufactured by applying a method of calcining the abrasive particle precursor at a temperature of 400° C. to 1,000° C. to the solid phase method.

The abrasive particles may include at least one of a metal oxide, an organic or inorganic matter-coated metal oxide, and the metal oxide in a colloidal state, and the metal oxide may include at least one of silica, ceria, zirconia, alumina, titania, barium titania, germania, mangania, and magnesia.

The abrasive particles may be dispersed as positive charges, and may be, for example, colloidal ceria dispersed as the positive charges. The colloidal ceria dispersed as the positive charges is mixed with an additive liquid activated into a positive charge so that higher step height-removing performance, excellent polishing speed, and automatic polishing stop function may be implemented.

The abrasive particles may include primary particles having a particle size of 5 nm to 150 nm and secondary particles having a particle size of 30 nm to 300 nm. An average particle diameter of the abrasive particles is an average particle diameter value of a plurality of particles within a view field range that can be measured by scanning electron microscope analysis or dynamic light scattering. In the particle size of the primary particles, the particle size of the primary particles should be 150 nm or less to secure particle uniformity, and the polishing rate may be lowered when the particle size of the primary particles is less than 5 nm. In the particle size of the secondary particles in the polishing slurry composition, cleaning ability is lowered, and flaws are excessively generated on a waver surface if small particles are excessively generated due to a milling operation when the particle size of the secondary particles is less than 30 nm. As an overpolishing operation is conducted when the particle size of the secondary particles is more than 300 nm, it becomes difficult to adjust selectivity, and there is a possibility that surface flaws such as dishing, erosion, defects, scratches and the like are generated.

The abrasive particles may include mixed particles having a multi-dispersion type particle distribution in addition to single-sized particles. For example, the mixed particles may have a bimodal type particle distribution by mixing two types of abrasive particles having different average particle sizes, a particle size distribution showing three peaks by mixing three types of abrasive particles having different average particle sizes, or a multi-dispersion type particle distribution by mixing four or more types of abrasive particles having different average particle sizes. The mixed particles may expect effects of having more excellent dispersibility and reducing scratches and defects on the wafer surface by mixing relatively large abrasive particles with relatively small abrasive particles.

According to an example embodiment of the present disclosure, the polishing liquid may be a positive slurry composition showing a positive charge and the polishing liquid may have a zeta potential range of +5 mV to +70 mV. Due to positively charged abrasive particles, the polishing liquid may reduce the generation of micro-scratches by maintaining high dispersion stability, thereby preventing the abrasive particles from being agglomerated.

According to an example embodiment of the present disclosure, the polishing liquid may further include a pH adjuster. For example, the pH adjuster may include: an acidic material including at least one of nitric acid, hydrochloric acid, phosphoric acid, sulfuric acid, hydrofluoric acid, bromic acid, iodic acid, formic acid, malonic acid, maleic acid, oxalic acid, acetic acid, adipic acid, citric acid, propionic acid, fumaric acid, salicylic acid, pimelic acid, benzoic acid, succinic acid, phthalic acid, butyric acid, glutaric acid, glutamic acid, glycolic acid, lactic acid, aspartic acid, tartaric acid, polyacrylic acid, polypropionic acid, polysalicylic acid, polybenzoic acid, polybutyric acid, and salts thereof; and one or more selected from the group consisting of ammonia, ammonium methyl propanol (AMP), tetramethyl ammonium hydroxide (TMAH), potassium hydroxide, sodium hydroxide, magnesium hydroxide, rubidium hydroxide, ammonium hydroxide, cesium hydroxide, sodium bicarbonate, sodium carbonate, and imidazole. The pH adjuster may be added in an amount of adjusting a pH value of the polishing liquid.

The pH value of the polishing liquid is desirably adjusted to obtain dispersion stability and proper polishing speed depending on abrasive particles, and the polishing liquid may have an acidic pH value range of 1 to 12, or 1 to 7, desirably 2 to 6.

According to an example embodiment of the present disclosure, the additive liquid may include: a polymer having an amide bond; and a cationic polymer. The additive liquid may adjust selectivity required during the polishing process depending on the used amount of the additive liquid to implement the multi-selectivity, and may provide a polishing slurry composition that may be utilized in various processes, for example, the semiconductor manufacturing process. For example, the additive liquid may enable adjustment of multi-selectivity and be used in the logic process by enabling polishing stop of a polysilicon film and polishing speed adjustment of a silicon oxide film and a silicon nitride film.

According to an example embodiment of the present disclosure, the polymer having the amide bond in the additive liquid may be applied as a polishing inhibitor for a polishing stop film during the polishing process. That is, the polymer having the amide bond is adsorbed onto the film when a polysilicon film in a gate poly is exposed during polishing of a pattern wafer to adjust polishing speed so that the polymer having the amide bond may perform an automatic polishing stop function on the polysilicon film and reduce surface flaws thereof such as scratches, etc.

The polymer having the amide bond may be present in an amount of 0.01 wt % to 0.2 wt % in the additive liquid. It is difficult to implement an automatic polishing stop function for a polishing stop film, for example, a polysilicon film when the polymer having the amide bond is present in an amount of less than 0.01 wt % in the additive liquid, and the polishing process is not sufficiently performed due to a polymer network, and residues may remain when the polymer having the amide bond is present in an amount of more than 0.2 wt % in the additive liquid.

The polymer having the amide bond is a nonionic polymer, and may include at least one of polymers represented by Chemical Formula 1.

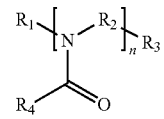

[Chemical Formula 1]

In Chemical Formula 1, $R_1$, $R_3$ and $R_4$ may be each selected from hydrogen, a hydroxy group, a $C_{1-30}$ alkyl group, a $C_{2-30}$ alkenyl group, a $C_{2-30}$ alkynyl group, a $C_{1-30}$ alkoxy group, a $C_{6-30}$ aryl group, a $C_{5-30}$ heteroaryl group including one or more heteroatoms of N, O or S, a $C_{4-30}$ heterocyclic group including one or more heteroatoms of N, O or S, a $C_{7-30}$ aralkyl group, an amine group, —NH($R_4$)—$R_5$ (herein, $R_4$ is a $C_{1-30}$ alkylene or a $C_{2-30}$ alkenylene, and $R_5$ is hydrogen or a hydroxy group), an oxyamine group, an azide group, and a thiol group.

$R_2$ may be a simple bond, a substituted or unsubstituted $C_{1-30}$ alkylene, a $C_{2-30}$ alkenylene, a $C_{7-30}$ cycloalkylene, a $C_{6-30}$ arylene, a $C_{7-30}$ arylalkylene, or a $C_{2-30}$ alkynylene.

n may be: an integer of 1 or more; an integer of 1 to 1,000; or an integer of 1 to 200.

For example, the polymer having the amide bond may include at least one of poly(2-methyl-2-oxazoline), poly(2-methyl-2-oxazoline) with a hydroxyl end group, poly(2-methyl-2-oxazoline) with α-benzyl and ω-azide ends, poly(2-methyl-2-oxazoline) with an azide end, poly(2-methyl-2-oxazoline) with a piperazine end, poly(2-ethyl-2-oxazoline), poly(2-ethyl-2-oxazoline) with an alkyne end, poly(2-ethyl-2-oxazoline) with α-benzyl and ω-thiol ends, poly(2-ethyl-2-oxazoline) with α-methyl and ω-hydroxyethylamine ends, poly(2-ethyl-2-oxazoline) with an amine end, poly(2-ethyl-2-oxazoline) with a piperazine end, poly(2-propyl-2-oxazoline), poly(2-propyl-2-oxazoline) with an azide end, and derivatives thereof.

The polymer having the amide bond may have: a weight average molecular weight (Mw) of 1,000 to 5,000,000; 1,000 to 1,000,000; or 1,000 to 500,000.

According to an example embodiment of the present disclosure, the cationic polymer in the additive liquid may control polishing speed and selectivity for a polishing target film, may exhibit, for example, a polishing speed increasing function for a silicon nitride film and a passivation function for a silicon oxide film, and may enable polishing speed adjustment and selectivity adjustment of the silicon oxide film and the silicon nitride film.

The cationic polymer may be present in an amount of 0.001 wt % to 0.01 wt % in the additive liquid. When the content of the cationic polymer deviates from the amount range, there is a problem that polishing performance is lowered as desired polishing rate and selectivity for the silicon oxide film and the silicon nitride film are not implemented.

The cationic polymer may include two or more of ionized cations within the molecular formula, and may include two or more of nitrogen activated into cations. Accordingly, viscosity of the cationic polymer may be adjusted. The cationic polymer may have a viscosity of 20 cps to 40 cps. The polishing rate of the silicon nitride film may be increased by adjusting the viscosity of the cationic polymer, and the selectivity of the silicon oxide film to the silicon nitride film may be controlled by controlling the polishing rate of the silicon oxide film.

According to an example embodiment, the cationic polymer may be formed in a quaternary ammonium form.

The cationic polymer may include, for example, at least one of: poly(diallyldimethylammonium chloride); poly[bis(2-chloroethyl) ether-alt-1,3-bis[3-(dimethylamino)propyl]urea]; ethanol, 2,2',2''-nitrilotris-, polymer with 1,4-dichloro-2-butene and N,N,N',N'-tetramethyl-2-butene-1,4-diamine; hydroxyethyl cellulose dimethyl diallylammonium chloride copolymer; copolymer of acrylamide and diallyldimethylammonium chloride; copolymer of acrylamide and quaternized dimethylammoniumethyl methacrylate; copolymer of acrylic acid and diallyldimethylammonium chloride; acrylamide-dimethylaminoethyl methacrylate methyl chloride copolymer; quaternized hydroxyethyl cellulose; copolymer of vinylpyrrolidone and quaternized dimethylaminoethyl methacrylate; copolymer of vinylpyrrolidone and quaternized vinylimidazole; copolymer of vinylpyrrolidone and methacrylamidopropyl trimethylammonium; poly(2-methacryloxyethyltrimethylammonium chloride); Poly(acrylamide 2-methacryloxyethyltrimethyl ammonium chloride); poly[2-(dimethylaminoethyl methacrylate methyl chloride]; poly[(3-acrylamidopropyl)trimethylammonium chloride]; poly[3-methacrylamidopropyl trimethylammonium chloride]; poly[oxyethylene(dimethylamino)ethylene (dimethylimino)ethylene dichloride]; terpolymer of acrylic acid, acrylamide, and diallyldimethylammonium chloride; terpolymer of acrylic acid, methacrylamidopropyl trimethylammonium chloride, and methyl acrylate; terpolymer of vinylcaprolactam, vinylpyrrolidone, and quaternized vinylimidazole; poly(2-methacryloxyethyl phosphorylchlorine-co-n-butyl methacrylate); poly[(dimethylamino)ethyl acrylate benzyl chloride quaternary salt] (PDMAEA BCQ); and poly[(dimethylamino)ethyl acrylate methyl chloride quaternary salt] (PDMAEA MCQ).

According to an example embodiment of the present disclosure, a content ratio of the polymer having the amide bond to the cationic polymer in the additive liquid (or, a mass ratio of the polymer having the amide bond to the cationic polymer) may be 20:1 to 30:1, and a ratio of the cationic polymer is changed so that polishing speed for a polishing target film may be adjusted, and multi-selectivity may be implemented.

According to an example embodiment of the present disclosure, the additive liquid may further include an amino acid which acts as a buffer, and the amino acid may be present in an amount of 0.1 wt % to 0.5 wt % in the additive liquid. There is a problem the amino acid may not act as a pH buffer when the amino acid is present in an amount of less than 0.1 wt % in the additive liquid, and an agglomeration phenomenon may occur, and there is a problem that residues exist within a wafer after performing the polishing process when the amino acid is present in an amount of more than 0.5 wt % in the additive liquid.

The amino acid may be an amino acid in which a side chain in chemical structure of amino acid has polarity, and may desirably include an amino acid having an uncharged side chain at a neutral pH value. The polar amino acid may include, for example, at least one of glutamine, threonine, serine, asparagine, cysteine, and tyrosine.

According to an example embodiment of the present disclosure, a pH value of the additive liquid may be adjusted to obtain a proper polishing speed, and the additive liquid may have an acidic pH value range of 1 to 7, desirably 2 to 6.

According to an example embodiment of the present disclosure, a polishing slurry composition according to the present disclosure may include water, desirably ultrapure water, deionized water or distilled water as a remainder constituent in addition to the constituents. Further, the polishing slurry composition may further include a concentration manufacturing process and/or a dilution process in the manufacturing process.

According to an example embodiment of the present disclosure, the polishing slurry composition may be provided in a two-liquid form in which the mixed solution is used after separately preparing the polishing liquid and the additive liquid and mixing the polishing liquid with the additive liquid right before the polishing process to obtain a mixed solution, or in a one-liquid form in which the polishing liquid is mixed with the additive liquid. Namely, when the polishing slurry composition according to the present disclosure is provided in the two-liquid form, the polishing slurry composition not only may enable polishing performance possessed by conventional art or performance that is more excellent than the polishing performance possessed by the conventional art to be implemented by injecting the cationic polymer into the additive liquid without adding the cationic polymer to a slurry (polishing liquid), but also may simplify the manufacturing process by enabling only the additive liquid to be appropriately applied to required processes without replacing the slurry by process. In addition, the polishing slurry composition may alleviate a problem of slurry dispersion stability according to polymer injection.

According to an example embodiment of the present disclosure, the polishing slurry composition may have a ratio (volume ratio) of the polishing liquid to the additive liquid of 1:1 to 5:1, and the ratio of the polishing liquid injected during the polishing process of the polishing liquid and the additive liquid to the additive liquid may be adjusted according to flow rate (ml/min). An inverse selectivity may be implemented as the amount of the additive liquid contained in the polishing slurry composition is increased so that the polishing rate of the silicon oxide film is decreased, and the polishing rate of the silicon nitride film is maintained when the ratio of the polishing liquid to the additive liquid is 1:1 to 1.5:1, and the polishing rate of the silicon oxide film may be highly maintained when the ratio of the polishing liquid to the additive liquid is 1.5:1 to 5:1.

For example, the flow rate of the polishing liquid in the polishing slurry composition may be adjusted within a range of 100 ml/min to 250 ml/min, and the flow rate of the additive liquid in the polishing slurry composition may be adjusted within a range of 30 ml/min to 200 ml/min. Polishing performance suitable for various semiconductor manufacturing processes may be implemented through control of a polishing stop function of the polysilicon film, polishing speeds of the silicon nitride film and the silicon oxide film, and/or polishing selectivity by adjusting the ratio and/or flow rate ratio. Further, when the flow rate of the additive liquid is increased at the flow rate ratio, it may be possible to implement inverse selectivity of the silicon oxide film to the silicon nitride film as the polishing speed of the silicon oxide film is decreased, and the polishing speed of the silicon nitride film is increased.

According to an example embodiment of the present disclosure, the polishing slurry composition may have a polishing speed for the polishing target film of: 100 Å/min or more; 800 Å/min or more; 1,000 Å/min or more; 1,400 Å/min or more; 2,000 Å/min or more; or 1,000 Å/min to 4,000 Å/min. A polishing speed for the polishing stop film may be low compared to the polishing target film, and the polishing stop film may be polished to a polishing speed of: 100 Å/min or less; 50 Å/min or less; or 20 Å/min or less.

According to an example embodiment of the present disclosure, when performing a polishing process using the polishing slurry composition, the polishing target film may be selectively removed, and a selectivity of the polishing target film to the polishing stop film may be: 50 or more; 100 or more; 200 or more; or 200 to 400 (a polishing speed of the polishing target film to the polishing stop film).

According to an example embodiment of the present disclosure, the polishing slurry composition may implement multi-selectivity and control a polishing speed and a selectivity of the polishing target film and/or a polishing speed and a selectivity of the polishing stop film depending on a ratio and a flow rate ratio of the polishing liquid and the additive liquid and/or a composition ratio of the additive liquid. Further, when polishing a pattern wafer using the polishing slurry composition, the polishing slurry composition may secure a high polishing rate in a high pattern density wafer as well as a low pattern density wafer, and may lower occurrence of surface flaws or the like.

For example, when polishing a substrate including a silicon oxide film, a silicon nitride film, and a polysilicon film by the polishing slurry composition, a polishing speed of the silicon oxide film may be 1,000 Å/min to 1,400 Å/min, a polishing speed of the silicon nitride film may be 700 Å/min to 1,300 Å/min, and a polishing speed of the polysilicon film may be 20 Å/min or less. A polishing selectivity of the silicon oxide film to the polysilicon film (the silicon oxide film/the polysilicon film) may be 200 or more. A polishing selectivity of the silicon oxide film to the silicon nitride film (the silicon oxide film/the silicon nitride film) may be: 1 or more; 1.3 or more; or 1.5 or more.

For another example, when polishing a substrate including a silicon oxide film, a silicon nitride film, and a polysilicon film by the polishing slurry composition, a polishing speed of the silicon oxide film may be 50 Å/min to 500 Å/min, a polishing speed of the silicon nitride film may be 700 Å/min to 1,000 Å/min, and a polishing speed of the polysilicon film may be 20 Å/min or less. In this case, a polishing selectivity of the silicon oxide film to the silicon nitride film (the silicon oxide film/the silicon nitride film) becomes 1 or less and may exhibit an inverse selectivity.

Hereinafter, the present disclosure will be described more in detail with reference to Examples and Comparative Examples. However, the following Examples and Comparative Examples are illustrative only, and the contents of the present disclosure are not limited thereto.

Examples 1 to 9

As shown in Table 1, additive liquids were prepared, and polishing liquids (0.3 to 0.4 mass % of abrasive particles, ph=4) including colloidal ceria abrasive particles with a primary particle size of 60 nm were prepared. A CMP polishing process was performed while injecting the polishing liquids and the additive liquids in flow rates suggested in Table 1.

Comparative Examples 1 and 2

As shown in Table 1, additive liquids were prepared, and polishing liquids (0.3 to 0.4 mass % of abrasive particles, pH=4) including colloidal ceria abrasive particles with a primary particle size of 60 nm were prepared. A CMP polishing process was performed while injecting the polishing liquids and the additive liquids in flow rates suggested in Table 1.

[Polishing Conditions]

1. Polisher: AP-300 (300 mm, KCTECH Co., Ltd.)
2. Pad: IC1000 (DOW Corporation)
3. Polishing time: 60 seconds
4. Platen revolutions per minute (RPM): 93 rpm
5. Spindle RPM: 87 rpm
6. Pressure: 3 psi
7. Flow rate: 15 ml/min to 250 ml/min
8. Wafers used: TEOS wafer, HT-NIT wafer, Gate Poly wafer, and STI NIT pattern wafer The following Table 1 shows polishing speeds (Removal Rates: RR) of a silicon oxide film (TEOS), a silicon nitride film, and a polysilicon film when polishing a pattern wafer by using the polishing liquids and the additive liquids of Examples and Comparative Examples.

TABLE 1

| Classification | Polishing slurry composition | | | | | | 300 mm CMP | | |
|---|---|---|---|---|---|---|---|---|---|
| | Polymer having amide bond | Cationic polymer | Amino acid | Amine compound | pH | Flow rate ratio | TEOS (polishing liquid: additive liquid (ml/min)) | SIN | Polysilicon |
| Example 1 | Aquazol 50.2% | Polyquaternium 0% | Serine 0.2% | — | 4.5~5.5 | 4:1 | 3541 | 735 | 12 |
| Example 2 | Aquazol 50.2% | Polyquaternium 0.02% | Serine 0.2% | — | 4.5~5.5 | 4:1 | 2979 | 1095 | 11 |
| Example 3 | Aquazol 50.2% | Polyquaternium 0.035% | Serine 0.2% | — | 4.5~5.5 | 4:1 | 2623 | 1028 | 9 |
| Example 4 | Aquazol 50.2% | Polyquaternium 0.05% | Serine 0.2% | — | 4.5~5.5 | 4:1 | 64 | 994 | 11 |
| Example 5 | Aquazol 50.2% | Polyquaternium 0.02% | Serine 0.2% | — | 4.5~5.5 | 2.5:1 | 2971 | 1206 | 14 |
| Example 6 | Aquazol 50.2% | Polyquaternium 0.02% | Serine 0.2% | — | 4.5~5.5 | 1:1 | 2341 | 1264 | 6 |
| Example 7 | Aquazol 50.2% | Polyquaternium 0.035% | Serine 0.2% | — | 4.5~5.5 | 2.5:1 | 2534 | 960 | 12 |
| Example 8 | Aquazol 50.2% | Polyquaternium 0.035% | Serine 0.2% | — | 4.5~5.5 | 1.5:1 | 1309 | 947 | 9 |
| Example 9 | Aquazol 50.2% | Polyquaternium 0.035% | Serine 0.2% | — | 4.5~5.5 | 1:1 | 259 | 861 | 6 |
| Comparative Example 1 | Aquazol 50.16% | – | Histidine 0.16% | PEHA 0.005% | 4.5~5.5 | 120~180 (slurry): 40~125 (additive) | 677 | 186 | 8 |
| Comparative Example 2 | Aquazol 50.16% | – | Histidine 0.16% | PEHA 0.005% | 4.5~5.5 | 135~195 (slurry): 30~95 (additive) | 715 | 167 | 5 |

PEHA: pentaethylenehexamine
Aquazol 5: poly(2-ethyl-2-oxazoline)
Polyquaternium: poly((2-methacryloxy)ethyl)trimethylammonium chloride Referring to Table 1, it can be confirmed that polishing speeds for the silicon oxide film are decreased although polishing speeds for the silicon nitride film maintain certain levels when the injection amount of the cationic polymer is increased in Examples 1 to 4. Particularly, it can be confirmed that selectivity (the silicon oxide film/the silicon nitride film) is shown to be an inverse selectivity of less than 1 as the polishing speed of the silicon oxide film is rapidly decreased in case of Example 4.

It is confirmed that Examples 5 and 6 show how the polishing speed changes when changing a flow rate ratio of the polishing liquid and the additive liquid, i.e., when increasing an addition ratio of the additive liquid although an injection amount of the cationic polymer in Examples 5 and 6 is the same as in Example 2, and it is confirmed that Examples 7, 8 and 9 show how the polishing speed changes when changing a flow rate ratio of the polishing liquid and the additive liquid, i.e., when increasing an addition ratio of the additive liquid although an injection amount of the cationic polymer in Examples 7, 8 and 9 is the same as in Example 3. It may be confirmed from both results that the selectivity (the silicon oxide film/the silicon nitride film) is decreased as the amount of the cationic polymer existing in the polishing slurry composition is substantially increased by increasing the ratio of the additive liquid. Particularly, it can be seen that an inverse selectivity is implemented as the selectivity (the silicon oxide film/the silicon nitride film) becomes 0.3 in case of Example 9. Therefore, it can be seen that the selectivity (the silicon oxide film/the silicon nitride film) tends to decrease more clearly as the injection amount of the cationic polymer increases, or as the amount of the additive liquid increases through flow rate adjustment of the polishing liquid and the additive liquid.

Further, it can be confirmed that a selectivity of the silicon oxide film to the silicon nitride film of 1.4:1, and performance of polysilicon polishing speed of less than 20 Å/min are implemented in Example 8. It can be confirmed that polishing performance values for the silicon nitride film and the silicon oxide film are low in Comparative Examples 1 and 2. The present disclosure may provide a polishing slurry composition which obtains an effect of ameliorating scratches after a polysilicon membrane is exposed when polishing a pattern wafer, enables implementation of multi-selectivity and adjustment of polishing speed depending on a target film during the polishing process, and may be used in a semiconductor manufacturing process, particularly a logic process.

Although the above-mentioned Examples have been described by limited Examples, those skilled in the art may apply various modifications and alterations from the above-mentioned description. For example, appropriate results can be achieved although described techniques are carried out in a different order from a described method, and/or described elements are combined or mixed in a different form from the described method, or replaced or substituted with other elements or equivalents. Therefore, other embodiments, other Examples, and equivalents to patent claims belong to the scope of the patent claims to be described later.

What is claimed is:

1. A polishing slurry composition comprising:
a polishing liquid including abrasive particles; and
an additive liquid,
wherein the additive liquid comprises a polymer having an amide bond, and a cationic polymer,
wherein the polymer having the amide bond is present in an amount of 0.01 wt % to 0.2 wt % in the additive liquid,
wherein the cationic polymer is present in an amount of 0.001 wt % to 0.01 wt % in the additive liquid,
wherein the polymer having the amide bond and the cationic polymer have a content ratio of 4:1 to 10:1, and
wherein, when polishing a substrate including a silicon oxide film, a silicon nitride film, and a polysilicon film by the polishing slurry composition, a polishing selectivity of the silicon oxide film to the silicon nitride film is 4.8 or less.

2. The polishing slurry composition of claim 1, wherein the polymer having the amide bond comprises at least one of polymers represented by the following chemical formula:

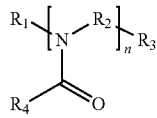

in which $R_1$, $R_3$ and $R_4$ are each selected from hydrogen, a hydroxy group, a $C_{1-30}$ alkyl group, a $C_{2-30}$ alkenyl group, a $C_{2-30}$ alkynyl group, a $C_{1-30}$ alkoxy group, a $C_{6-30}$ aryl group, a $C_{5-30}$ heteroaryl group including one or more heteroatoms of N, O or S, a $C_{4-30}$ heterocyclic group including one or more heteroatoms of N, O or S, a $C_{7-30}$ aralkyl group, an amine group, —NH($R_4$)—$R_5$ (herein, $R_4$ is a $C_{1-30}$ alkylene or a $C_{2-30}$ alkenylene, and $R_5$ is hydrogen or a hydroxy group), an oxyamine group, an azide group, and a thiol group,
$R_2$ is a simple bond, a substituted or unsubstituted $C_{1-30}$ alkylene, a $C_{2-30}$ alkenylene, a $C_{7-30}$ cycloalkylene, a $C_{6-30}$ arylene, a $C_{7-30}$ arylalkylene, or a $C_{2-30}$ alkynylene, and
n is an integer of 1 or more.

3. The polishing slurry composition of claim 1, wherein the polymer having the amide bond comprises at least one selected from the group consisting of poly(2-methyl-2-oxazoline), poly(2-methyl-2-oxazoline) with a hydroxyl end group, poly(2-methyl-2-oxazoline) with α-benzyl and ω-azide ends, poly(2-methyl-2-oxazoline) with an azide end, poly(2-methyl-2-oxazoline) with a piperazine end, poly(2-ethyl-2-oxazoline), poly(2-ethyl-2-oxazoline) with an alkyne end, poly(2-ethyl-2-oxazoline) with α-benzyl and ω-thiol ends, poly(2-ethyl-2-oxazoline) with α-methyl and ω-hydroxyethylamine ends, poly(2-ethyl-2-oxazoline) with an amine end, poly(2-ethyl-2-oxazoline) with a piperazine end, poly(2-propyl-2-oxazoline), poly(2-propyl-2-oxazoline) with an azide end, and derivatives thereof.

4. The polishing slurry composition of claim 1, wherein the polymer having the amide bond has a weight average molecular weight of 1,000 to 5,000,000.

5. The polishing slurry composition of claim 1, wherein the cationic polymer comprises at least one selected from the group consisting of: poly(diallyldimethylammonium chloride); poly[bis(2-chloroethyl) ether-alt-1,3-bis[3-(dimethylamino)propyl]urea]; ethanol, 2,2',2''-nitrilotris-, polymer with 1,4-dichloro-2-butene and N,N,N',N'-tetramethyl-2-butene-1,4-diamine; hydroxyethyl cellulose dimethyl diallylammonium chloride copolymer; copolymer of acrylamide and diallyldimethylammonium chloride; copolymer of acrylamide and quaternized dimethylammoniumethyl methacrylate; copolymer of acrylic acid and diallyldimethylammonium chloride; acrylamide-dimethylaminoethyl methacrylate methyl chloride copolymer; quaternized hydroxyethyl cellulose; copolymer of vinylpyrrolidone and quaternized dimethylaminoethyl methacrylate; copolymer of vinylpyrrolidone and quaternized vinylimidazole; copolymer of vinylpyrrolidone and methacrylamidopropyl trimethylammonium; poly(2-methacryloxyethyltrimethylammonium chloride); Poly(acrylamide 2-methacryloxyethyltrimethyl ammonium chloride); poly[2-(dimethylaminoethyl methacrylate methyl chloride]; poly[(3-acrylamidopropyl)trimethylammonium chloride]; poly[3-methacrylamidopropyl trimethylammonium chloride]; poly[oxyethylene(dimethylamino)ethylene (dimethylimino) ethylene dichloride]; terpolymer of acrylic acid, acrylamide, and diallyldimethylammonium chloride; terpolymer of acrylic acid, methacrylamidopropyl trimethylammonium chloride, and methyl acrylate; terpolymer of vinylcaprolactam, vinylpyrrolidone, and quaternized vinylimidazole; poly(2-methacryloxyethyl phosphorylchlorine-co-n-butyl methacrylate); poly[(dimethylamino)ethyl acrylate benzyl chloride quaternary salt] (PDMAEA BCQ); and poly[(dimethylamino)ethyl acrylate methyl chloride quaternary salt] (PDMAEA MCQ).

6. The polishing slurry composition of claim 1, wherein the abrasive particles have a positive charge on the surface thereof.

7. The polishing slurry composition of claim 1, wherein the abrasive particles comprise at least one of a metal oxide, an organic or inorganic matter-coated metal oxide, and the metal oxide in a colloidal state, and
the metal oxide comprises at least one selected from the group consisting of silica, ceria, zirconia, alumina, titania, barium titania, germania, mangania, and magnesia.

8. The polishing slurry composition of claim 1, wherein the abrasive particles comprise primary particles having a particle size of 5 nm to 150 nm and secondary particles having a particle size of 30 nm to 300 nm, and
the abrasive particles are present in an amount of 0.1 wt % to 10 wt % in the polishing slurry composition.

9. The polishing slurry composition of claim 1, wherein the additive liquid further comprises amino acid, and
the amino acid is present in an amount of 0.1 wt % to 0.5 wt % in the additive liquid.

10. The polishing slurry composition of claim 9, wherein the amino acid is a polar amino acid, and
the polar amino acid comprises at least one selected from the group consisting of glycine, serine, threonine, cysteine, tyrosine, asparagine, and glutamine.

11. The polishing slurry composition of claim 1, wherein the polishing liquid and the additive liquid have a ratio (volume ratio) of 1:1 to 5:1 during a polishing process using the polishing slurry composition, and
the ratio is adjusted according to a flow rate when injecting the polishing liquid and the additive liquid.

12. The polishing slurry composition of claim 1, wherein, when polishing the substrate including the silicon oxide film, the silicon nitride film, and the polysilicon film by the polishing slurry composition, the silicon oxide film has a polishing speed of 1,000 Å/min to 4,000 Å/min, the silicon nitride film has a polishing speed of 700 Å/min to 1,300 Å/min, and a polishing selectivity of the silicon oxide film to the polysilicon film is 200 or more.

13. The polishing slung composition of claim 1, wherein, when polishing the substrate including the silicon oxide film, the silicon nitride film, and the polysilicon film by the polishing slurry composition, the silicon oxide film has a polishing speed of 50 Å/m n to 500 Å/min, and the silicon nitride film has a polishing speed of 700 Å/min to 1,000 Å/min.

14. The polishing slurry composition of claim 13, wherein the polysilicon film has a polishing speed of 20 Å/min or less.

\* \* \* \* \*